United States Patent
Zeller et al.

(10) Patent No.: US 10,234,524 B2
(45) Date of Patent: Mar. 19, 2019

(54) SHIFTED PULSES FOR SIMULTANEOUS MULTI-SLICE IMAGING

(71) Applicant: Siemens Healthcare GmbH, Erlangen (DE)

(72) Inventors: Mario Zeller, Erlangen (DE); Himanshu Bhat, Newton, MA (US); Vibhas S. Deshpande, Austin, TX (US)

(73) Assignee: Siemens Healthcare GmbH, Erlangen (DE)

( * ) Notice: Subject to any disclaimer, the term of this patent is extended or adjusted under 35 U.S.C. 154(b) by 332 days.

(21) Appl. No.: 15/296,071

(22) Filed: Oct. 18, 2016

(65) Prior Publication Data
US 2018/0106877 A1  Apr. 19, 2018

(51) Int. Cl.
G01R 33/56 (2006.01)
G01R 33/483 (2006.01)
G01R 33/561 (2006.01)

(52) U.S. Cl.
CPC ..... G01R 33/4835 (2013.01); G01R 33/5602 (2013.01); G01R 33/5607 (2013.01); G01R 33/5611 (2013.01); G01R 33/5617 (2013.01)

(58) Field of Classification Search
CPC ............ G01R 33/4833; G01R 33/4835; G01R 33/5602; G01R 33/5607; G01R 33/5611; G01R 33/5617
USPC ................................................. 324/300–322
See application file for complete search history.

(56) References Cited

U.S. PATENT DOCUMENTS

| | | | | |
|---|---|---|---|---|
| 5,406,203 A * | 4/1995 | Oh | ...................... | G01R 33/4835 324/307 |
| 7,538,549 B2 * | 5/2009 | Takei | ................... | G01R 33/561 324/307 |
| 7,755,356 B1 * | 7/2010 | Shenoy | .............. | G01R 33/5617 324/307 |
| 8,593,141 B1 * | 11/2013 | Radparvar | ........... | G01R 33/323 324/248 |
| RE45,725 E * | 10/2015 | Mugler, III | ........ | G01R 33/5615 |
| 9,295,406 B2 * | 3/2016 | Zuehlsdorff | ............ | A61B 5/055 |
| 9,339,239 B2 * | 5/2016 | Wang | ................... | A61B 5/7221 |
| 9,594,134 B2 * | 3/2017 | Smith | .................. | G01R 33/446 |

(Continued)

OTHER PUBLICATIONS

Weiss et al., Clinical Evaluation of Simultaneous Multi-Slice Diffusioin-weighted Magnetic Resonance Imaging of the Prostate. Proc. Intl. Soc. Mag. Reson. Med. 24 (2016). (Year: 2016).*

(Continued)

*Primary Examiner* — Patrick Assouad
*Assistant Examiner* — Sean Curtis

(57) ABSTRACT

A computer-implemented method for performing multi-slice magnetic resonance imaging with comparable contrast between simultaneously excited slices includes applying a first pulse sequence to a volume of interest to acquire a first k-space dataset. This first pulse sequence comprises a plurality of single-band slice-selective pulses applied in a first predefined order. One or more additional pulse sequences are also applied to the volume of interest to acquire one or more additional k-space datasets. Each additional pulse sequence comprises the plurality of single-band slice-selective pulses applied in one or more additional predefined orders that are distinct from the first predefined order. One or more final images are reconstructed using the first k-space dataset and the one or more additional k-space datasets.

22 Claims, 7 Drawing Sheets

(56) References Cited

U.S. PATENT DOCUMENTS

| | | | |
|---|---|---|---|
| 9,671,481 B2* | 6/2017 | Ugurbil | G01R 33/543 |
| 9,689,948 B2* | 6/2017 | Ugurbil | A61B 5/055 |
| 9,869,737 B2* | 1/2018 | Grinstead | G01R 33/4835 |
| 10,054,652 B2* | 8/2018 | Bhat | G01R 33/4828 |
| 10,054,653 B2* | 8/2018 | Zhong | G01R 33/4835 |
| 10,088,541 B2* | 10/2018 | Paul | G01R 33/4835 |
| 2004/0051527 A1* | 3/2004 | Mugler, III | G01R 33/5615 324/309 |
| 2004/0181146 A1* | 9/2004 | Yarnykh | A61B 5/055 600/419 |
| 2005/0233327 A1* | 10/2005 | Welch | C12Q 1/6897 506/9 |
| 2006/0257866 A1* | 11/2006 | Welch | B82Y 30/00 435/6.18 |
| 2008/0180098 A1* | 7/2008 | Takei | G01R 33/561 324/309 |
| 2011/0160583 A1* | 6/2011 | Roche | A61B 8/565 600/438 |
| 2013/0079679 A1* | 3/2013 | Roche | A61B 5/103 600/594 |
| 2013/0079680 A1* | 3/2013 | Stein | A61B 5/107 600/594 |
| 2013/0342200 A1* | 12/2013 | Ugurbil | G01R 33/543 324/307 |
| 2014/0253120 A1* | 9/2014 | Ugurbil | A61B 5/055 324/309 |
| 2015/0071514 A1* | 3/2015 | Wang | A61B 5/7221 382/131 |
| 2015/0115958 A1* | 4/2015 | Wang | G01R 33/4835 324/309 |
| 2015/0204957 A1* | 7/2015 | Smith | G01R 33/446 324/309 |
| 2015/0226819 A1* | 8/2015 | Paul | G01R 33/4835 324/309 |
| 2015/0346300 A1* | 12/2015 | Setsompop | G01R 33/4828 324/309 |
| 2015/0362574 A1* | 12/2015 | Wu | G01R 33/4835 324/322 |
| 2016/0018502 A1* | 1/2016 | Wang | G01R 33/246 324/307 |
| 2016/0117829 A1* | 4/2016 | Yoon | G06T 7/50 348/222.1 |
| 2016/0154080 A1* | 6/2016 | Wiens | G01R 33/56536 324/309 |
| 2017/0074960 A1* | 3/2017 | Bhat | G01R 33/5616 |
| 2017/0108567 A1* | 4/2017 | Bhat | G01R 33/5602 |
| 2017/0146624 A1* | 5/2017 | Paul | G01R 33/4835 |
| 2017/0199259 A1* | 7/2017 | Beck | G01R 33/5611 |
| 2017/0293010 A1* | 10/2017 | Bhat | G01R 33/5611 |
| 2017/0315202 A1* | 11/2017 | Bhat | G01R 33/5617 |
| 2017/0322275 A1* | 11/2017 | Zhong | G01R 33/4835 |
| 2018/0024214 A1* | 1/2018 | Bhat | G01R 33/4828 324/309 |
| 2018/0031659 A1* | 2/2018 | Bhat | G01R 33/5602 |
| 2018/0045799 A1* | 2/2018 | Wang | A61B 5/004 |
| 2018/0074146 A1* | 3/2018 | Bhat | G01R 33/4828 |
| 2018/0074147 A1* | 3/2018 | Carinci | G01R 33/4835 |
| 2018/0106877 A1* | 4/2018 | Zeller | G01R 33/4835 |
| 2018/0246178 A1* | 8/2018 | Wang | G01R 33/246 |

OTHER PUBLICATIONS

Zhu et al., Hybrid-Space SENSE Reconstruction for Simultaneous Multi-Slice MRI. IEEE Transactions on Medical Imaging, vol. 35, No. 8, Aug. 2016 (Year: 2016).*

Castanar et al., Simultaneous Multi-Slice Excitation in Spatially Encoded NMR Experiments. Chemistry: A European Journal. Wiley-VCH Verlag GmbH & Co. 2013 (Year: 2013).*

Ertan et al., A Z-Gradient Array for Simultaneous Multi-Slice Excitation With a Single-Band RF Pulse. Magnetic Resonance in Medicine 00:00-00 (2017) (Year: 2017).*

Feinberg et al., Ultra-fast MRI of the human brain with simultaneous multi-slice imaging. Journal of Magnetic Resonance 229 (2013) 90-100 (Year: 2013).*

Gaby Pell. Multiband I: Introduction to SMS sequences. Mar. 2017 (Year: 2017).*

Barth et al., Simultaneous Multislice (SMS) Imaging Techniques. Magnetic Resonance in Medicine 75:63-81 (2016) (Year: 2016).*

Ugurbil et al. MRI Method Reduces Peak Power for Multiband Images, Jul. 2017 (Year: 2017).*

* cited by examiner

SHIFTED PULSES FOR SIMULTANEOUS MULTI-SLICE IMAGING

TECHNOLOGY FIELD

The present invention relates generally to methods, systems, and apparatuses for performing simultaneous multi-slice Magnetic Resonance Imaging (MRI) using single-band pulses in a manner that provides similar contrast to multi-band applications.

BACKGROUND

Simultaneous multi-slice (SMS) is an acceleration technique in which several slices are excited and acquired simultaneously leading to a k-space dataset which comprising several slices collapsed on top of each other. Separating or uncollapsing these slices is performed during image reconstruction with the slice GeneRalized Autocalibrating Partial Parallel Acquisition (GRAPPA) method. Excitation, refocusing or magnetization preparation (mag-prep) for these simultaneously acquired slices is performed using a multi-band radio frequency (RF) pulse, as shown in FIG. 2A. A multi-band RF pulse is generated by superposition of the individual single band RF pulses which are typically used to excite/refocus/mag-prep a single slice in conventional MRI. Using a multi band RF pulse ensures that imaging parameters like echo time (TE), inversion time (TI) etc. are identical for all the simultaneously acquired slices.

One drawback of using a multi-band RF pulse is the increase in peak RF power which increases by a factor equal to the number of simultaneously acquired slices (due to superposition as shown in FIG. 2A). The higher peak power requirement is typically not a problem for excitation pulses, but can become a prohibiting factor for refocusing or magnetization preparation (saturation recovery, inversion recovery, Driven Equilibrium Fourier Transform (DEFT) magnetization restore etc.) pulses.

Various techniques have been proposed for addressing the problem of peak RF power for SMS imaging including VErsatile Reaction SEparation (VERSE), the use of phase scrambling during imaging, and the use of time-shifted multi-band pulses during imaging. Each of these techniques has significant drawbacks that limit their general applicability to clinical imaging scenarios. For example, the VERSE technique leads to distorted slice profiles for off-resonance spins. Moreover, each of these techniques still requires a peak power value which is higher than that needed for a single band RF pulse. This can still pose a problem for high power pulses like adiabatic inversion with a hyperbolic secant pulse, or adiabatic saturation pulses, or DEFT restore pulses used in SMS TSE imaging etc.

SUMMARY

Embodiments of the present invention address and overcome one or more of the above shortcomings and drawbacks, by providing methods, systems, and apparatuses related to the use of shifted pulses for simultaneous multi-slice imaging. The techniques described herein require the same peak power as a single band RF pulse and, thus may be applied to high power magnetization preparation pulses including, without limitation, adiabatic inversion with a hyperbolic secant pulse, adiabatic saturation pulses, or DEFT restore pulses used in SMS TSE imaging.

According to some embodiments, A computer-implemented method for performing multi-slice magnetic resonance imaging with comparable contrast between simultaneously excited slices includes applying a first pulse sequence to a volume of interest to acquire a first k-space dataset. This first pulse sequence comprises a plurality of single-band slice-selective pulses applied in a first predefined order. One or more additional pulse sequences are also applied to the volume of interest to acquire one or more additional k-space datasets. Each additional pulse sequence comprises the plurality of single-band slice-selective pulses applied in one or more additional predefined orders that are distinct from the first predefined order. In some embodiments, the additional predefined orders are defined by cyclically shifting the first predefined order to yield an average inversion time (TI) for all slices in the volume of interest. One or more final images are reconstructed using the first k-space dataset and the one or more additional k-space datasets.

Various techniques may be used for reconstructing the k-space datasets. For example, in some embodiments of the aforementioned method, final images are reconstructed by averaging the k-space datasets to yield a combined k-space dataset and then reconstructing the final images using the combined k-space dataset. In other embodiments, the final images are reconstructed by reconstructing a plurality of images, with each image corresponding to one of the datasets. The final images are generated by averaging each of these images.

Various pulse sequences may be used with the aforementioned method. In some embodiments, the pulse sequences each utilize Short-TI Inversion Recovery (STIR) to null fat in the volume of interest. In other embodiments, the pulse sequences are each a Turbo Inversion Recovery Magnitude (TIRM) sequence. In still other embodiments, the pulse sequences are each a DEFT sequence. The number of pulses included in each pulse sequence may be selected, for example, based on a SMS factor selected by a user.

In some embodiments of the aforementioned method, pulse sequences each further comprise a plurality of multi-band slice-selective excitation pulses. Additionally, the pulse sequences may comprise multi-band slice-selective refocusing pulses.

According to other embodiments of the present invention, a computer-implemented method for performing multi-slice magnetic resonance imaging includes acquiring a k-space dataset representative of a volume of interest using an acquisition process. This acquisition process includes the application of single-band slice-selective pulses to the volume of interest. These single-band slice-selective pulses are spaced according to a predefined echo spacing period selected to provide an identical inversion time for each of the plurality of single-band slice-selective pulses. The method further includes applying single-band slice-selective excitation pulses to the volume of interest. These single-band slice-selective excitation pulses are spaced according to the predefined echo spacing period. In some embodiments, following application of the single-band slice-selective excitation pulses, multi-band slice-selective pulses are applied to the volume of interest. The k-space dataset is generated using a plurality of echo trains resulting from the plurality of single-band slice-selective excitation pulses. Then, one or more images are reconstructed image based on the k-space dataset.

According to other embodiments, a system for performing multi-slice magnetic resonance imaging with comparable contrast between simultaneously excited slices comprises a RF generator and an image processing computer. The RF generator is configured to use RF coils to apply a first pulse sequence to a volume of interest to acquire a first k-space dataset. This first pulse sequence includes a plurality of single-band slice-selective pulses applied in a first predefined order. The RF generator additionally applies one or more additional pulse sequences to the volume of interest to acquire one or more additional k-space datasets. Each additional pulse sequence comprises the plurality of single-band slice-selective pulses applied in one or more additional predefined orders that are distinct from the first predefined order. In some embodiments, each of the additional predefined orders is defined by cyclically shifting the first predefined order to yield an average TI for all slices in the volume of interest. Once the data is acquired, the image processing computer reconstructs one or more images based on the first k-space dataset and the one or more additional k-space datasets.

Various pulse sequences may be used with the aforementioned system. For example, in some embodiments, pulse sequences each utilize STIR to null fat in the volume of interest. In other embodiments, the pulse sequences are each a TIRM sequence. In still other embodiments, the pulse sequences are each a DEFT sequence. The pulse sequences may each further comprise a plurality of multi-band slice-selective excitation pulses. Additionally, the pulse sequences may each further comprise a plurality of multi-band slice-selective refocusing pulses. The number of pulses included in each pulse sequence may be based, for example, on a Simultaneous Multi-Slice (SMS) factor selected by a user.

According to another aspect of the present invention, a system for performing multi-slice magnetic resonance comprises a Radio Frequency (RF) generator and an image processing computer. The RF generator is configured to use a plurality of RF coils to apply a plurality of single-band slice-selective pulses to a volume of interest. The single-band slice-selective pulses are spaced according to a predefined echo spacing period selected to provide an identical inversion time for each of the plurality of single-band slice-selective pulses. The RF generator is further configured to apply a plurality of single-band slice-selective excitation pulses to the volume of interest. These single-band slice-selective excitation pulses are spaced according to the predefined echo spacing period. A k-space dataset representative of the volume of interest is acquired using a plurality of echo trains resulting from the plurality of single-band slice-selective excitation pulses. In some embodiments, the plurality of RF coils is further used to apply a plurality of multi-band slice-selective pulses to the volume of interest, following application of the plurality of single-band slice-selective excitation pulses and one or more single band refocusing pulses between the single-band slice-selective excitation pulses. The image processing computer is configured to reconstruct an image based on the k-space dataset.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to using shifted pulses for simultaneous multi-slice imaging. In some embodiments, individual single-band RF pulses are played consecutively in time in order to sequentially alter the magnetization of slices which are being acquired simultaneously. In other embodiments, multiple pulse sequences are used during image acquisition and averaging is used to provide comparable contrast across slices. Other embodiments, utilize a predefined echo spacing between individual inversion recovery (IR) pulses, while also using the same echo spacing between excitation pulses, to provide identical T1 contrast across slices. These techniques have the advantage of requiring the same peak power as a single band RF pulse and lower peak power compared to conventional solutions.

Figure 1:
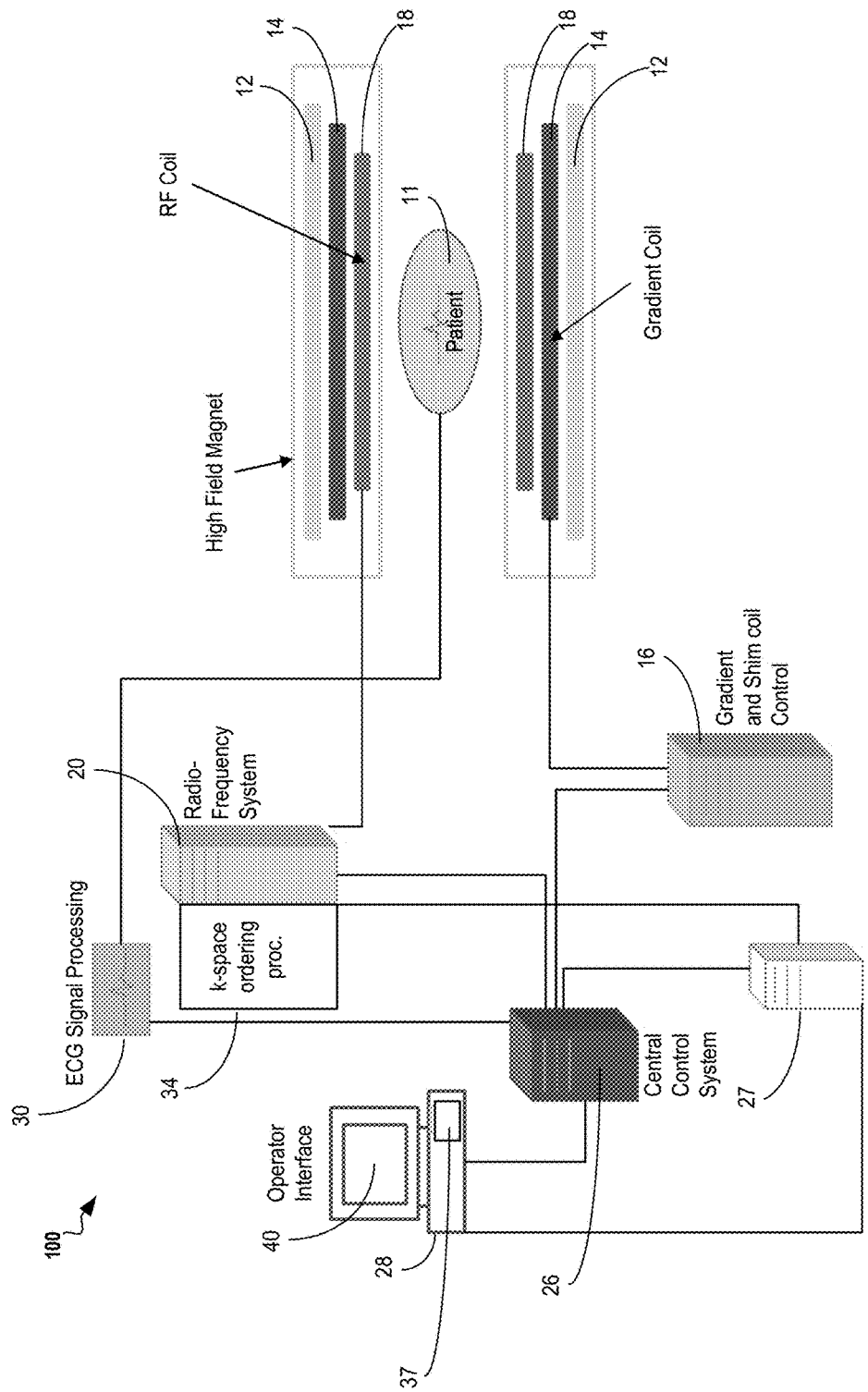
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing magnetic resonance imaging (MRI) data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. Electrocardiography (ECG) synchronization signal generator 30 provides ECG signals used for pulse sequence and imaging synchronization. A two or three dimensional k-space storage array of individual data elements in k-space component processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components are sequentially acquired during acquisition of a magnetic resonance dataset representing a magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components which are substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques generally known in the art may be used for reconstruction.

Figure 2A:
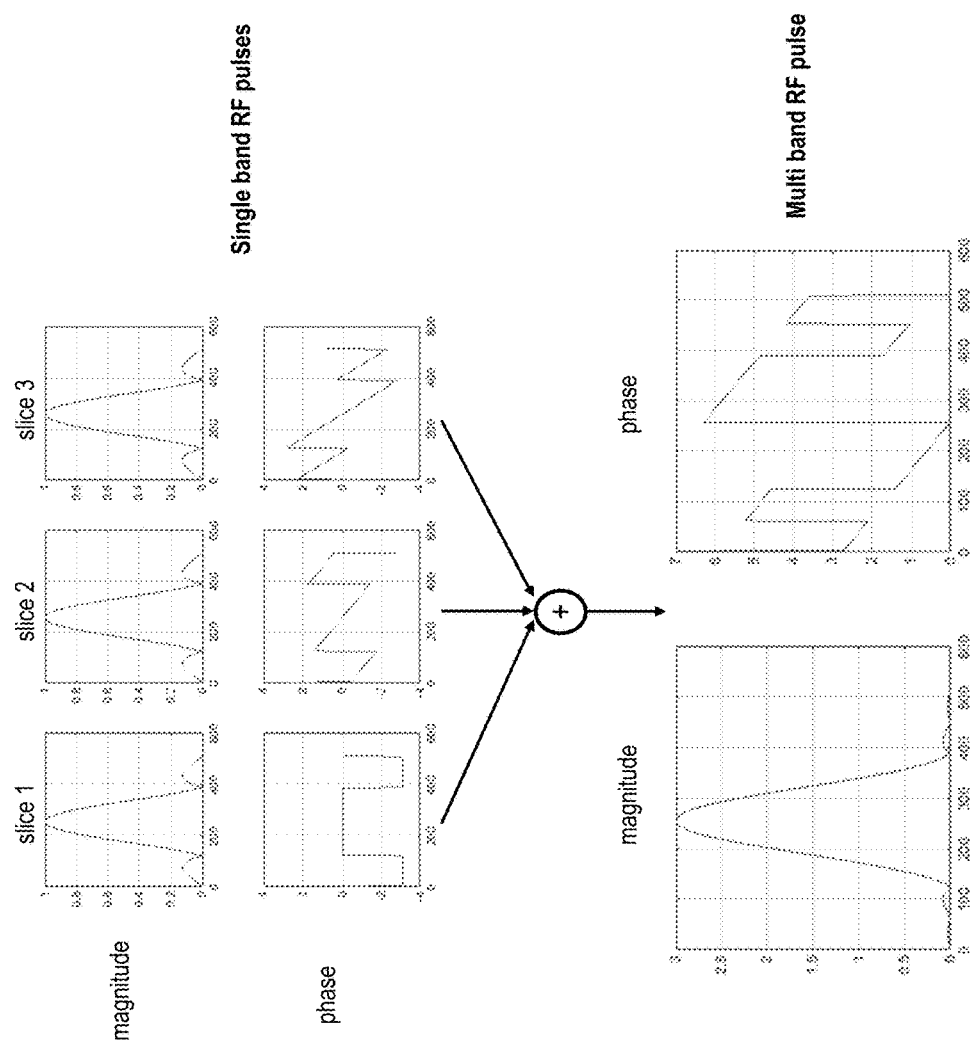
FIG. 2A provides an illustration of a conventional SMS multi band RF pulse.
Figure 2B:
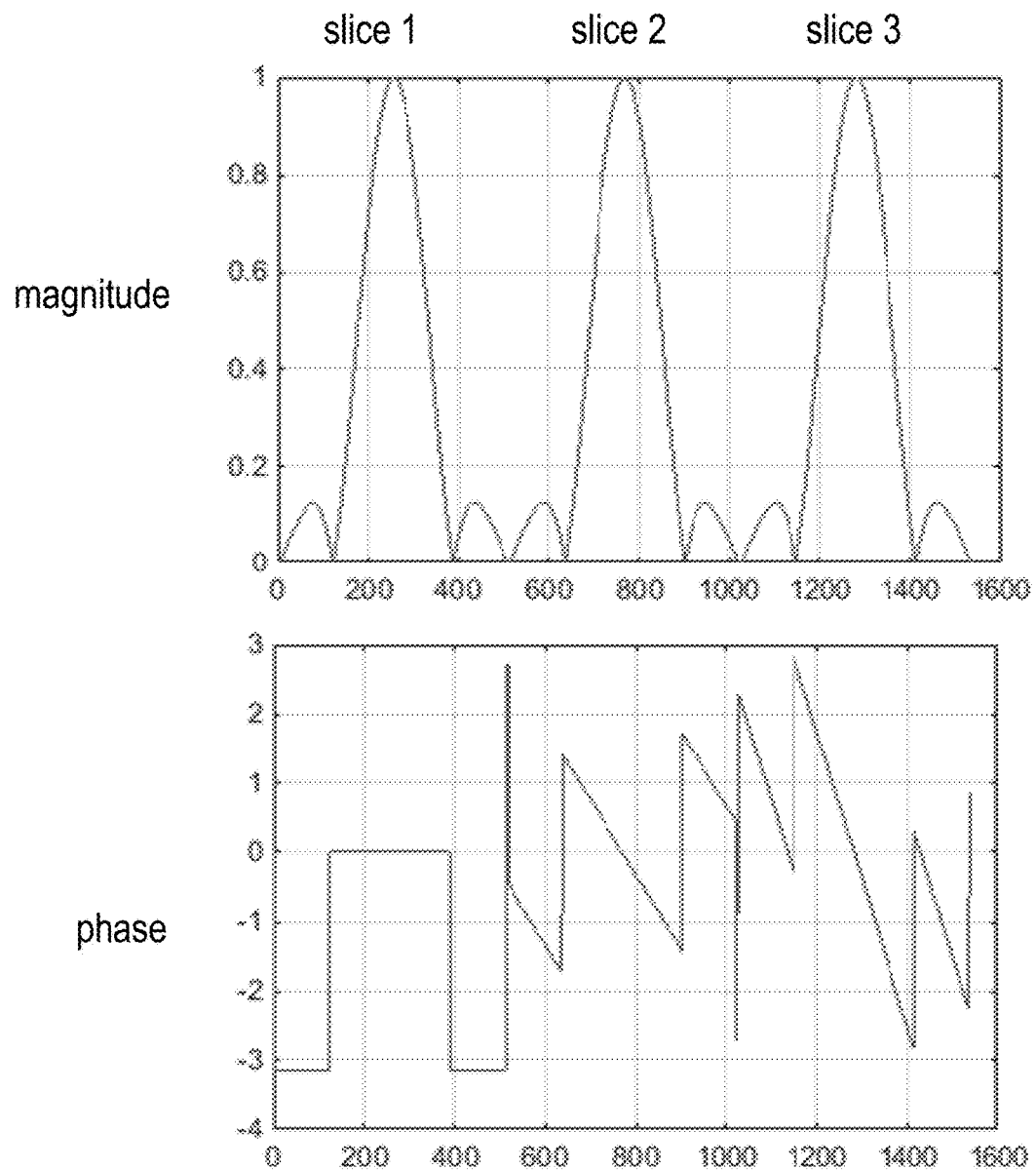
FIG. 2B illustrates the sequential placement of single band RF pulses in time to create similar RF profile as the multi band RF pulse but with a lower peak power.

FIG. 2B illustrates the sequential placement of single band RF pulses in time to create similar RF profile as the multi band RF pulse but with a lower peak power. As shown in FIG. 2B, the individual single-band RF pulses are played consecutively in time in order to sequentially alter the magnetization of slices which are being acquired simultaneously. This technique has the advantage that it requires the same peak power as a single band RF pulse and hence is applicable to high power magnetization preparation pulses like adiabatic inversion with a hyperbolic secant pulse, or adiabatic saturation pulses, or DEFT restore pulses used in SMS TSE imaging etc. The technique shown in FIG. 2B will become of special importance to enable SMS techniques for future low-cost systems where the peak RF power is expected to be limited.

In conventional imaging with magnetization preparation, there is a preparation pulse for a slice following by a waiting time and readout is performed. Using the technique shown in FIG. 2B, a readout for 3 slices is performed simultaneously. Thus, three single band preparation pulses are applied successfully in a brief time period (e.g., 20 ms). This is followed by the normal waiting time and the readout of the three slices simultaneously, as in the conventional system. The phase shown in FIG. 2B is essentially a concatenation of the three phases shown in FIG. 2A. It should be noted that the change in phase shown in FIG. 2B allows the center of frequency of the pulses (i.e., the Larmor frequency) to be constant. As an alternative, in other embodiments, the center frequency of each pulse is varied in a manner that supports slice selection while phase is kept constant (or near constant) across all pulses.

The brief time period allows any motion in the region of interest to be negligible during imaging. Timing effects can also be minimized by acquiring data in different slice orders and averaging the results. For example, for the simple case of an SMS acquisition with a multiband factor of 2, the first slice may be prepared followed by the second slice. Then, a second acquisition can be performed with the slice preparation order reversed (i.e., preparing the second slice first). The results may then be averaged to eliminate motion artifacts to some extent. This general concept can be extended to high multiband factors, using different permutations of slice acquisitions across for each acquisition sequence that is performed.

Figure 3A:
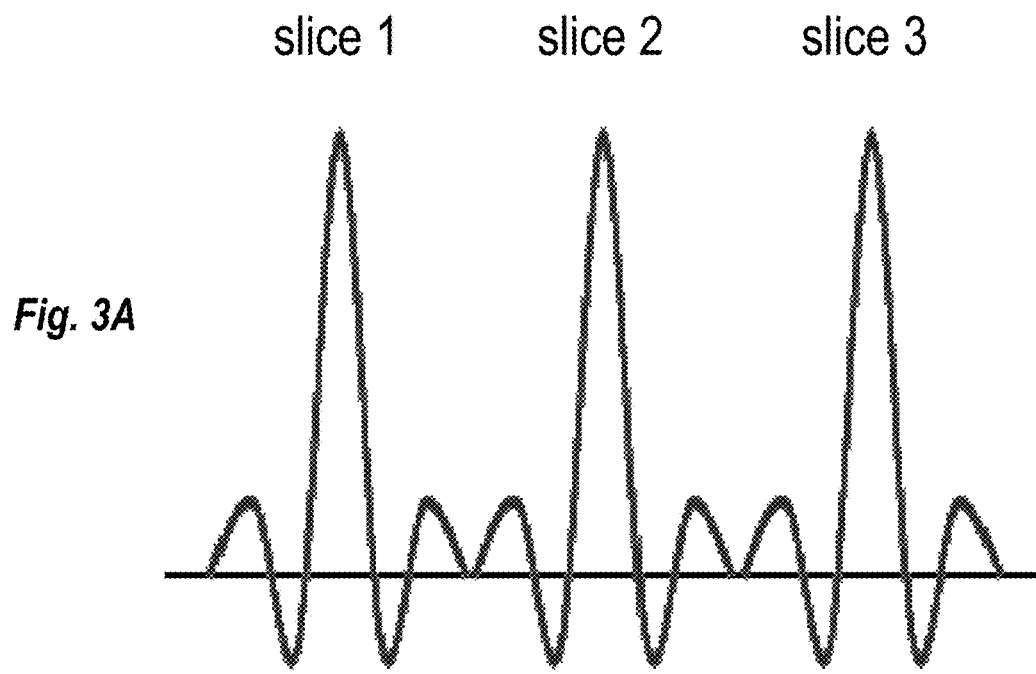
FIG. 3A illustrates a pulse sequence according to some embodiments where there is complete separation of the pulses.
Figure 3B:
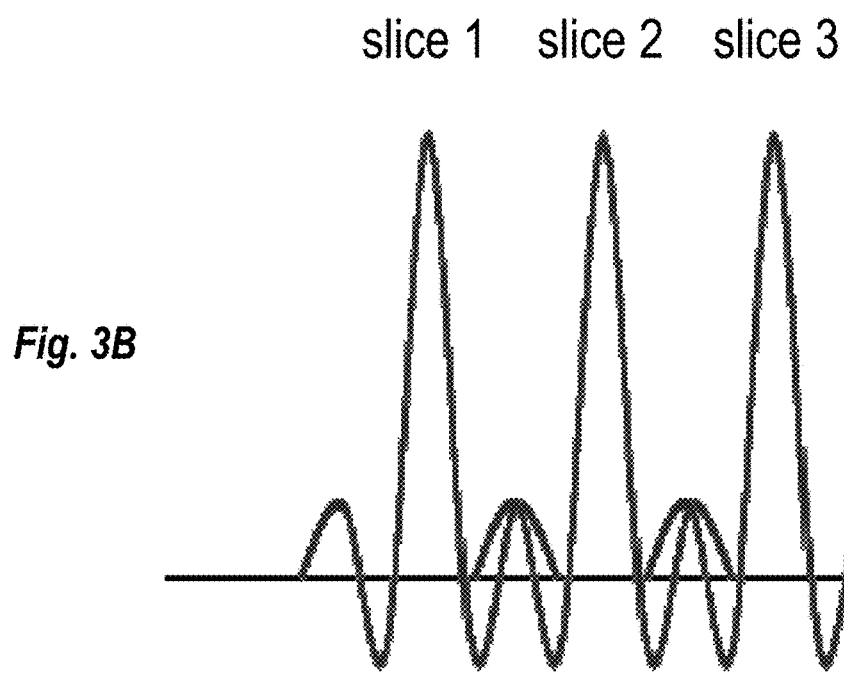
FIG. 3B illustrates a pulse sequence according to some embodiments where there is three partially overlapping pulses.

Since the limited peak power becomes a limiting factor (especially for the pulse main lobe), it is also possible to separate the pulses not completely in time but instead shift the respective pulses in a way that only their side lobes overlap and the main lobes are still separated. FIGS. 3A and 3B illustrate how this overlap could be implemented in some embodiments. More specifically, FIG. 3A shows complete separation of the pulses (similar sequence discussed above with reference to FIG. 2B), while FIG. 3B shows three partially overlapping pulses. The magnitude and phase of each pulse may be set in a manner which is similar to that discussed above with reference to FIG. 2B.

In general, the pulses illustrated in FIG. 3B may be overlapped to any degree desired. However, in the extreme case where the pulses fully overlap, the acquisition is essentially identical to the conventional multi-band acquisition shown in FIG. 2A. Thus, to provide the benefits of minimizing the peak power requirement, the degree of overlap should generally be set to a value which ensures that the desired peak power will be achieved. In some embodiments, the degree of overlap may be selected by the operator of the scanner (e.g., by inputting a value or using slider in a graphical user interface). In this way, the operator has the flexibility to tailor the peak power as desired based on factors such as the capabilities of the hardware and type of scan being performed.

In some embodiments, the acquisition sequence comprises a plurality of sections, each with differently designed multi-band pulses. For example, a multi-band IR TSE sequence combined with a DEFT restore pulse may comprise IR pulses which are played out as single-band pulses for the individual slices as proposed in the techniques discussed herein, an echo train comprising conventionally superimposed multi-band RF excitation, refocussing pulses, and finally single-band DEFT restore pulses for the individual slices.

A potential drawback of the proposed method is that the imaging parameters like TE, TI etc. are slightly different for each individual slice; this effect is expected to be negligible for some applications, especially for clinically feasible SMS factors in the range of 2 to 4. For example, the TI for a fluid attenuation inversion recovery (FLAIR) brain examination is approximately 2500 ms. A shift of the pulses will only lead to a change in TI which is two orders of magnitude below this value and is thus not expected to have a relevant impact. A change in the timing of DEFT magnetization restore pulses is also expected to have only minimal impact as the next data acquisition of the respective slice will only occur after another TR period which is also at least two orders of magnitude above the time shift between two DEFT pulses.

For other applications the impact of the proposed method on the image contrast might become significant. In some embodiments of the present invention, pulses sequences may be utilized which shift pulses to provide comparable contrast between the simultaneously excited slices. This may be of special interest for, for example, in Short-TI Inversion Recovery (STIR) and Turbo Inversion Recovery Magnitude (TIRM) imaging of body regions like abdomen, breast, joints or heart where the TI times typically are around 150-250 ms and, thus, a time shifting of pulses has a bigger influence on contrast than for FLAIR imaging in the brain (TI around 2-3 seconds)

Figure 4A:
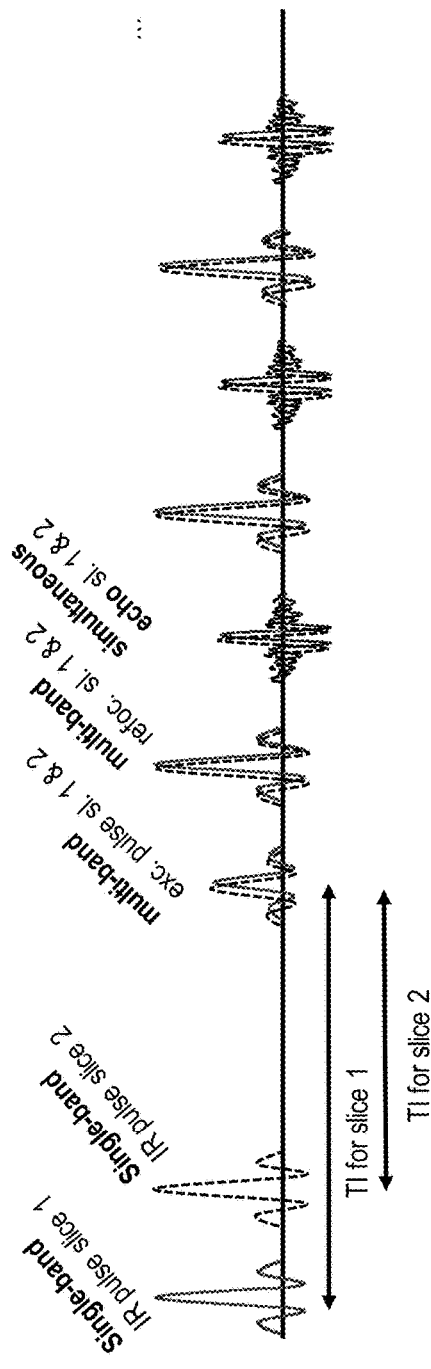
FIG. 4A illustrate a technique for providing comparable contrast between the simultaneously excited slices, according to some embodiments.
Figure 4B:
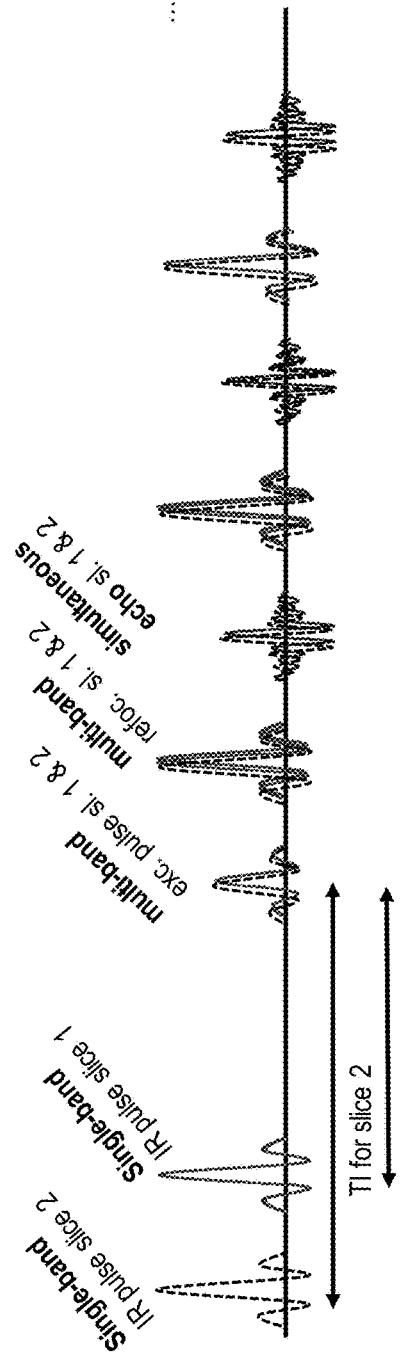
FIG. 4B provides a continuation of the technique illustrated in FIG. 4A.

FIGS. 4A and 4B illustrate a first technique for providing comparable contrast between the simultaneously excited slices, according to some embodiments. This technique may be applied, for example, in IR or DEFT applications. In this example, two slices are acquired using two sequences which vary according to the order in which the slice selective pulses are applied. More specifically, in FIG. 4A the pulse sequence comprises plurality of single-band slice-selective IR pulses applied in a predefined order where the first IR pulse is applied to the first slice and then the subsequent pulse is applied to the second slice. In FIG. 4B, the order is reversed such that the first IR pulse is applied to the second slice and then the subsequent pulse is applied to the first slice. For each sequence, the IR pulses are followed by multi-band slice-selective excitation and refocusing pulses which result in simultaneous echoes from the individual slices. These echoes are used to produce a k-space dataset for each sequence (i.e., application of FIG. 4A results in a k-space dataset and FIG. 4B results in a second dataset). The datasets are then averaged to produce a combined dataset which can be used to reconstruct an image for each slice. In another embodiment, the datasets are reconstructed first and the final images of the first repetition depicted in FIG. 4A and the second repetition depicted in FIG. 4B are averaged in a final step.

Although FIGS. 4A and 4B illustrate the averaging technique for 2 pulses, it should be understood that technique may be scaled to larger numbers of pulses based on the SMS factor selected, for example, by the operator. If the averaging is performed with data equal to SMS factor, the shifts between each sequence can be cyclic to come up with an average TI time for all slices without exceeding peak power requirements. If the number of averages is lower than the SMS factor, only some permutations can be performed. For the example of an SMS factor of 3 and 2 averages, the pulses can be played out in temporal order for slice 1, slice 2, slice 3 in the first run and in temporal order slice 3, slice 2, slice 1 in the second run. Here, TI for slice 2 stays identical for both repetitions while TI for slices 1 and slice 3 are interchanged and will become comparable to TI for slice 2 after averaging has been performed.

Figure 5:
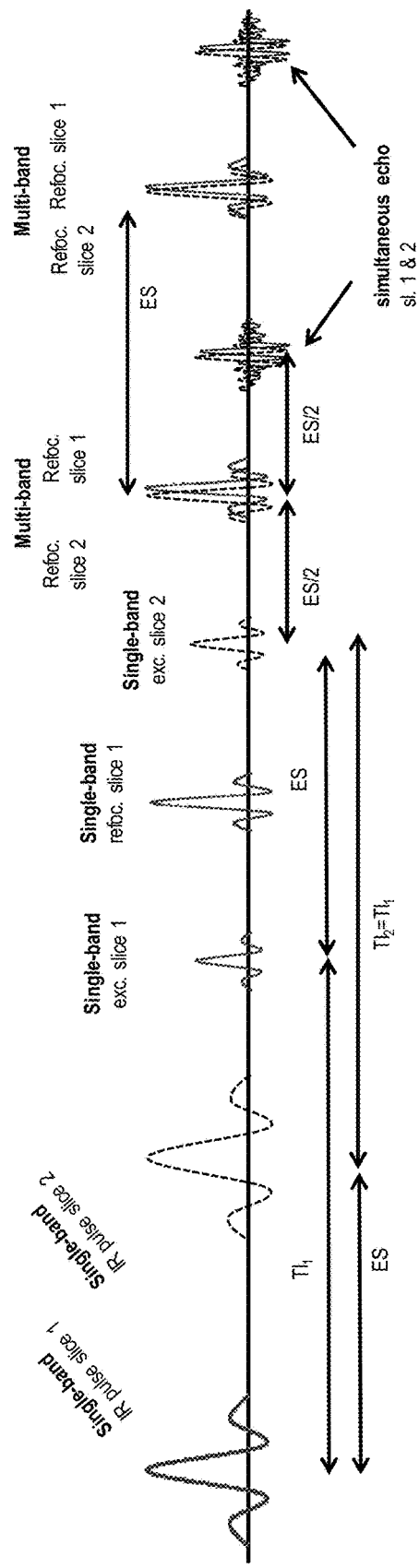
FIG. 5 illustrates a second technique for providing comparable contrast between the simultaneously excited slices, according to some embodiments, where a single average is used.

FIG. 5 illustrates a second technique for providing comparable contrast between the simultaneously excited slices, according to some embodiments, where a single average is used. In this example, identical TI is achieved for each IR pulse by shifting the echo trains for slices 1 and 2 against each other and by time-shifting the IR pulses by that predefined the echo spacing (ES). The influence of the IR contrast will be much more prominent than the $T_2$ contrast such that the contrast between both slices should be more similar to that achieved when using different TI times for both slices.

In the example of FIG. 5, two single-band slice-selective IR pulses are applied to the volume of interest. These two pulses are spaced based on the ES period, as discussed above. Following application of the IR pulses, slice-selective excitation pulses are applied to the volume of interest, again spaced by the ES period. Shifting the excitation pulses resulting in a shift to the echo trains by the amount of time between the inversion/saturation pulses. In turn, this allows the TI to be the same for both pulses. Note that, for completeness, FIG. 5 additionally shows multi-band refocusing pulses applied to the slices as soon as the second slice has been excited. Between the excitation pulses for slice 1 and slice 2, one or more single-band refocusing pulses can be used to refocus only the magnetization of slice 1 which already has been excited.

Figure 6:
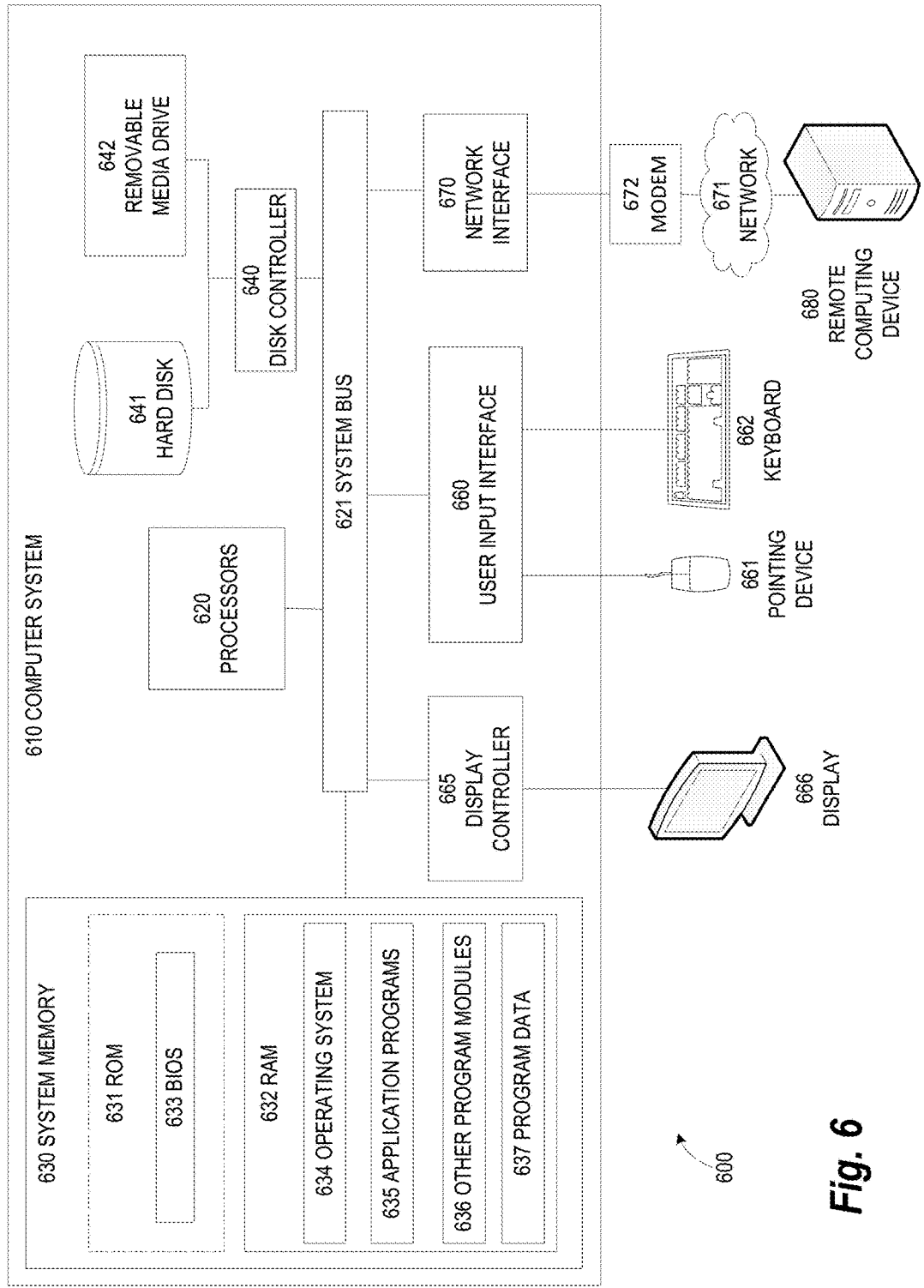
FIG. 6 illustrates an exemplary computing environment within which embodiments of the invention may be implemented.

FIG. 6 illustrates an exemplary computing environment 600 within which embodiments of the invention may be implemented. For example, the computing environment 600 may be used to implement one or more of the components illustrated in the system 100 of FIG. 1. The computing environment 600 may include computer system 610, which is one example of a computing system upon which embodiments of the invention may be implemented. Computers and computing environments, such as computer system 610 and computing environment 600, are known to those of skill in the art and thus are described briefly here.

As shown in FIG. 6, the computer system 610 may include a communication mechanism such as a bus 621 or other communication mechanism for communicating information within the computer system 610. The computer system 610 further includes one or more processors 620 coupled with the bus 621 for processing the information. The processors 620 may include one or more central processing units (CPUs), graphical processing units (GPUs), or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device (s) (e.g., programmable ROM, erasable PROM, and electrically erasable PROM). In addition, the system memory 630 may be used for storing temporary variables or other intermediate information during the execution of instructions by the processors 620. A basic input/output system (BIOS) 633 containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hardwired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computer 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A computer-implemented method for performing multi-slice magnetic resonance imaging with comparable contrast between simultaneously excited slices, the method comprising:
    applying a first pulse sequence to a volume of interest to acquire a first k-space dataset, the first pulse sequence comprising a plurality of single-band slice-selective pulses applied in a first predefined order;
    applying one or more additional pulse sequences to the volume of interest to acquire one or more additional k-space datasets, each additional pulse sequence comprising the plurality of single-band slice-selective pulses applied in one or more additional predefined orders that are distinct from the first predefined order; and
    reconstructing one or more final images using the first k-space dataset and the one or more additional k-space datasets.

2. The method of claim 1, wherein the one or more final images are reconstructed by:
    averaging the first k-space dataset and the one or more additional k-space datasets to yield a combined k-space dataset; and
    reconstructing the one or more final images using the combined k-space dataset.

3. The method of claim 1, wherein the one or more final images are reconstructed by:
    reconstructing a plurality of images using the first k-space dataset and the one or more additional k-space datasets, each image corresponding to a distinct dataset;
    averaging the plurality of images to yield the one or more final images.

4. The method of claim 1, wherein each of the one or more additional predefined orders are defined by cyclically shifting the first predefined order to yield an average inversion time (TI) for all slices in the volume of interest.

5. The method of claim 1, wherein the first pulse sequence and the one or more additional pulse sequences each utilize Short-TI Inversion Recovery (STIR) to null fat in the volume of interest.

6. The method of claim 1, wherein the first pulse sequence and the one or more additional pulse sequences are each a Turbo Inversion Recovery Magnitude (TIRM) sequence.

7. The method of claim 1, wherein the first pulse sequence and the one or more additional pulse sequences are each a Driven Equilibrium Fourier Transform (DEFT) sequence.

8. The method of claim 1, wherein the first pulse sequence and the one or more additional pulse sequences each further comprise a plurality of multi-band slice-selective excitation pulses.

9. The method of claim 8, wherein the first pulse sequence and the one or more additional pulse sequences each further comprise a plurality of multi-band slice-selective refocusing pulses.

10. The method of claim 1, where the number of pulses included in each of the first pulse sequence and the one or more additional pulse sequences is based on a Simultaneous Multi-Slice (SMS) factor selected by a user.

11. A computer-implemented method for performing multi-slice magnetic resonance imaging, the method comprising:
    acquiring a k-space dataset representative of a volume of interest using an acquisition process comprising:
        applying a plurality of single-band slice-selective pulses to the volume of interest, wherein the plurality of single-band slice-selective pulses are spaced according to a predefined echo spacing period selected to provide an identical inversion time for each of the plurality of single-band slice-selective pulses,
        applying a plurality of single-band slice-selective excitation pulses to the volume of interest, wherein the plurality of single-band slice-selective excitation pulses are spaced according to the predefined echo spacing period, and
        generating the k-space dataset using a plurality of echo trains resulting from the plurality of single-band slice-selective excitation pulses; and
    reconstructing an image based on the k-space dataset.

12. The method of claim 11, wherein the acquisition process further comprises:

following application of the plurality of single-band slice-selective excitation pulses, applying a plurality of multi-band slice-selective pulses to the volume of interest.

13. A system for performing multi-slice magnetic resonance imaging with comparable contrast between simultaneously excited slices, the system comprising:
a Radio Frequency (RF) generator configured to use a plurality of RF coils to:
apply a first pulse sequence to a volume of interest to acquire a first k-space dataset, the first pulse sequence comprising a plurality of single-band slice-selective pulses applied in a first predefined order;
apply one or more additional pulse sequences to the volume of interest to acquire one or more additional k-space datasets, each additional pulse sequence comprising the plurality of single-band slice-selective pulses applied in one or more additional predefined orders that are distinct from the first predefined order;
an image processing computer configured to reconstruct one or more images based on the first k-space dataset and the one or more additional k-space datasets.

14. The system of claim 13, wherein each of the one or more additional predefined orders are defined by cyclically shifting the first predefined order to yield an average inversion time (TI) for all slices in the volume of interest.

15. The system of claim 13, wherein the first pulse sequence and the one or more additional pulse sequences each utilize Short-TI Inversion Recovery (STIR) to null fat in the volume of interest.

16. The system of claim 13, wherein the first pulse sequence and the one or more additional pulse sequences are each a Turbo Inversion Recovery Magnitude (TIRM) sequence.

17. The system of claim 13, wherein the first pulse sequence and the one or more additional pulse sequences are each a Driven Equilibrium Fourier Transform (DEFT) sequence.

18. The system of claim 13, wherein the first pulse sequence and the one or more additional pulse sequences each further comprise a plurality of multi-band slice-selective excitation pulses.

19. The system of claim 18, wherein the first pulse sequence and the one or more additional pulse sequences each further comprise a plurality of multi-band slice-selective refocusing pulses.

20. The system of claim 13, where the number of pulses included in each of the first pulse sequence and the one or more additional pulse sequences is based on a Simultaneous Multi-Slice (SMS) factor selected by a user.

21. A system for performing multi-slice magnetic resonance, the system comprising:
a Radio Frequency (RF) generator configured to use a plurality of RF coils to:
apply a plurality of single-band slice-selective pulses to a volume of interest, wherein the plurality of single-band slice-selective pulses are spaced according to a predefined echo spacing period selected to provide an identical inversion time for each of the plurality of single-band slice-selective pulses,
apply a plurality of single-band slice-selective excitation pulses to the volume of interest, wherein the plurality of single-band slice-selective excitation pulses are spaced according to the predefined echo spacing period, and
acquire a k-space dataset representative of the volume of interest using a plurality of echo trains resulting from the plurality of single-band slice-selective excitation pulses; and
an image processing computer configured to reconstruct an image based on the k-space dataset.

22. The system of claim 21, wherein the plurality of RF coils is further used to:
apply a plurality of multi-band slice-selective pulses to the volume of interest, following application of the plurality of single-band slice-selective excitation pulses and one or more single band refocusing pulses between the single-band slice-selective excitation pulses.

* * * * *